United States Patent
Chen et al.

(10) Patent No.: US 8,854,089 B2
(45) Date of Patent: Oct. 7, 2014

(54) POWER SWITCH DRIVING CIRCUITS AND POWER CONVERTERS THEREOF

(71) Applicant: Silergy Semiconductor Technology (Hangzhou) Ltd, Hangzhou (CN)

(72) Inventors: Wei Chen, Saratoga, CA (US); Xiaoru Xu, Hangzhou (CN)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 0 days.

(21) Appl. No.: 13/886,491

(22) Filed: May 3, 2013

(65) Prior Publication Data
US 2013/0342243 A1    Dec. 26, 2013

(30) Foreign Application Priority Data

Jun. 25, 2012  (CN) .......................... 2012 1 0209697

(51) Int. Cl.
*H03K 3/00*     (2006.01)
*H03K 17/16*    (2006.01)
*H03K 3/353*    (2006.01)

(52) U.S. Cl.
CPC .............. *H03K 3/353* (2013.01); *H03K 17/162* (2013.01)
USPC ............................. 327/109; 326/83; 327/384

(58) Field of Classification Search
USPC ......... 327/384, 108–112, 376, 377, 379–383, 327/385–391, 427, 430–434, 437; 326/82, 326/83
See application file for complete search history.

(56) References Cited

U.S. PATENT DOCUMENTS

| | | | | |
|---|---|---|---|---|
| 5,173,621 | A  * | 12/1992 | Fraser et al. ..................... | 326/78 |
| 6,175,598 | B1 * | 1/2001  | Yu et al. ......................... | 375/257 |
| 6,208,041 | B1 * | 3/2001  | Majumdar et al. ............ | 307/113 |
| 6,420,924 | B1 * | 7/2002  | Lundberg ....................... | 327/333 |
| 7,554,367 | B2 * | 6/2009  | Chen et al. .................... | 327/112 |
| 2009/0237126 | A1 | 9/2009 | Chen | |
| 2011/0228564 | A1 | 9/2011 | Uruno | |

FOREIGN PATENT DOCUMENTS

CN           202260995 U       5/2012

* cited by examiner

*Primary Examiner* — Lincoln Donovan
*Assistant Examiner* — Thomas Skibinski
(74) *Attorney, Agent, or Firm* — Michael C. Stephens, Jr.

(57) ABSTRACT

In one embodiment, a power switch driving circuit can include: (i) an upper switch having a first power terminal coupled to a voltage source, and a second power terminal coupled to a driving signal; (ii) a lower switch having a first power terminal coupled to the driving signal, and a second power terminal coupled to a first voltage level, where the first voltage level is higher than a first ground potential; (iii) an upper switch driving sub circuit configured to receive a control signal, and to drive the upper switch in response thereto; and (iii) a lower switch driving sub circuit configured to receive the control signal, and to drive the lower switch in response thereto, where the upper and lower switch driving sub circuits are coupled to a second ground potential.

12 Claims, 5 Drawing Sheets

US 8,854,089 B2

POWER SWITCH DRIVING CIRCUITS AND POWER CONVERTERS THEREOF

RELATED APPLICATIONS

This application claims the benefit of Chinese Patent Application No. 201210209697.4, filed on Jun. 25, 2012, which is incorporated herein by reference in its entirety.

FIELD OF THE INVENTION

The present invention relates to the field of electronics, and more specifically to power switch driving circuits and power converters.

BACKGROUND

As integrated circuit fabrication process develops rapidly with increased operating frequencies and accuracy requirements, factors like signal integrity and anti-interference are becoming more and more important. Instability on power leads and ground may be caused by transient alternating current that is relatively large under the high-speed switching state of the device and/or inductance in the circuit loop. A relatively large current rush may result in power supply and ground noise (e.g., ground bounce). For example, when a chip is powered up, a relatively large transient current may flow through the chip and power plane. Inductance and resistance in the chip package and on the power plane may cause such noise, and lead to fluctuation and variation on the power leads or ground lines. The large amount of transient current flowing through the impedance of the ground loop can raise the ground potential, thereby deviating from the ideal ground potential. This ground bounce phenomenon may disturb the output signal and internal logic of the chip, possibly resulting in chip function errors.

SUMMARY

In one embodiment, a power switch driving circuit can include: (i) an upper switch having a first power terminal coupled to a voltage source, and a second power terminal coupled to a driving signal; (ii) a lower switch having a first power terminal coupled to the driving signal, and a second power terminal coupled to a first voltage level, where the first voltage level is higher than a first ground potential; (iii) an upper switch driving sub circuit configured to receive a control signal, and to drive the upper switch in response thereto; and (iii) a lower switch driving sub circuit configured to receive the control signal, and to drive the lower switch in response thereto, where the upper and lower switch driving sub circuits are coupled to a second ground potential.

In one embodiment, a power converter can include: (i) a power stage circuit configured to be controlled by the driving signal; (ii) a control circuit configured to generate the control signal; and (iii) the power switch driving circuit, configured to generate the driving signal according to the control signal.

In one embodiment, an integrated driving circuit configured to drive a power switch in a power stage circuit, can include: (i) a push-pull driving sub circuit comprising an upper switch and a lower switch, an upper switch driving sub circuit, and a lower switch driving sub circuit, where the power stage circuit is coupled to a first ground potential and the integrated driving circuit is coupled to a second ground potential, and where the first ground potential is connected to the second ground potential through a connecting wire; (ii) a first power terminal of the upper switch is coupled to a voltage source, and a second power terminal of the upper switch is coupled to a first power terminal of the lower switch; (iii) a second power terminal of the lower switch is coupled to a first voltage level, where the first voltage level is higher than a voltage level of the first ground potential; and (iv) the upper and lower switch driving sub circuits are configured to receive a control signal to respectively drive the upper and lower switches, where a driving signal is generated at a common node of the upper and lower switches to control the power switch.

Embodiments of the present invention can advantageously provide several advantages over conventional approaches. For example, particular embodiments can provide power switch driving circuits and associated power converters that substantially avoid large voltage fluctuations on the ground level. Other advantages of the present invention may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A basic function of a driving circuit is to convert a control signal received from a circuit to a driving signal. The driving signal can be arranged between a control terminal of a power device (e.g., a power switch) and a common terminal. Also, the driving circuit should realize electric isolation between a control circuit (e.g., that generates the control signal) and a main circuit (e.g., including the power switch). One example of an output driving circuit can generally include a push-pull connected upper transistor and a lower transistor. However, voltage fluctuations on the power leads or ground may not be reduced by using this kind of output driving circuit.

Figure 1A:
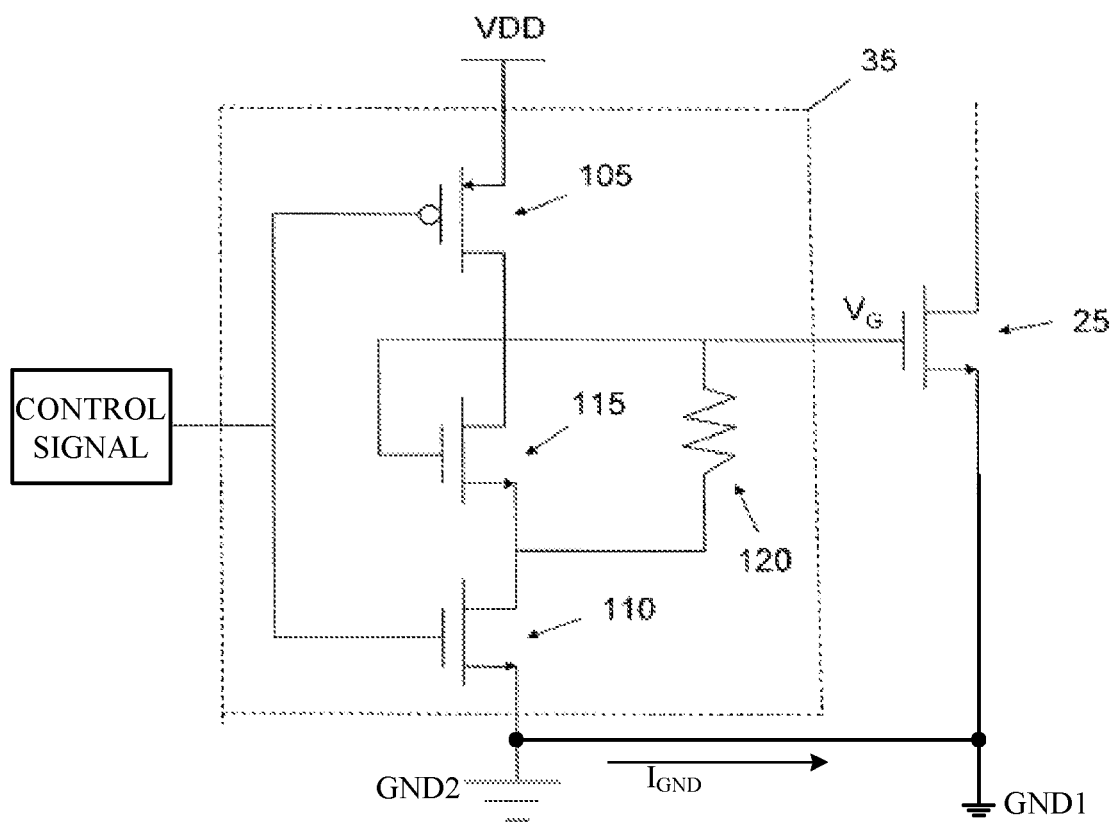
FIG. 1A shows a schematic diagram of an example power switch driving circuit.

With reference to FIG. 1A, shown is an example power switch driving circuit. This particular example power switch driving circuit can include transistors 105, 110, and 115, and resistor 120. The sources of transistor 110 and power switch 25 can connect to ground. Transistors 105 and 110 can receive a control signal to generate corresponding driving signal $V_G$ for power switch 25. Transistor 115 and resistor 120 can be used to optimize a state-transition time of power switch 25 (e.g., convert to an on-state from an off-state).

Figure 1B:
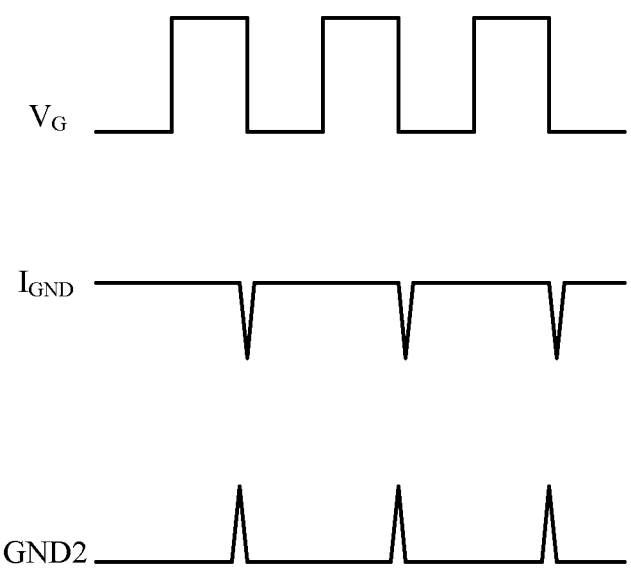
FIG. 1B is a waveform diagram showing an example operation of the power switch driving circuit of FIG. 1A.

With reference to FIG. 1B, shown is a waveform diagram of the power switch driving circuit shown in FIG. 1A. Parasitic inductances and resistors on the connecting wires between ground potential GND1 and ground potential GND2, and parasitic capacitors of power switch 25 may result in voltage fluctuation on ground potential GND2. Such voltage fluctuations can lead to current $I_{GND}$ between ground potentials GND1 and GND2 as shown.

In particular embodiments, power switch driving circuits and associated power converters can complementarily control (e.g., based on a control signal) the series connected upper and lower switches through corresponding upper and lower switch driving sub circuits, respectively. In this way, a driving signal may be output at a common node of the upper and lower switches to control (e.g., via a gate connection) a power switch. In particular embodiments, a second power terminal of the lower power switch can connect to an independent first voltage level rather than the ground potential, so as to avoid voltage fluctuations on the ground wire caused by the parasitic inductance, parasitic capacitance of the connecting wire, and/or parasitic capacitance of the power switch when the power switch is off. Therefore, a power switch driving circuit in particular embodiments can achieve a better driving result, and improve the system stability and reliability, as compared to conventional approaches. A power switch driving circuit in particular embodiments can be configured to drive various types of power switches, such as MOSFET metal oxide semiconductor transistors.

In one embodiment, a power switch driving circuit can include: (i) an upper switch having a first power terminal coupled to a voltage source, and a second power terminal coupled to a driving signal; (ii) a lower switch having a first power terminal coupled to the driving signal, and a second power terminal coupled to a first voltage node, where the first voltage node has a voltage higher than a ground potential; (iii) an upper switch driving sub circuit configured to receive a control signal, and to drive the upper switch in response thereto; and (iii) a lower switch driving sub circuit configured to receive the control signal, and to drive the lower switch in response thereto, where the upper and lower switch driving sub circuits are coupled to the ground potential.

In one embodiment, a power converter can include: (i) a power stage circuit configured to be controlled by the driving signal; (ii) a control circuit configured to generate the control signal; and (iii) the power switch driving circuit, configured to generate the driving signal according to the control signal.

In one embodiment, an integrated driving circuit configured to drive a power switch in a power stage circuit, can include: (i) a push-pull driving sub circuit comprising an upper switch and a lower switch, an upper switch driving sub circuit, and a lower switch driving sub circuit, where the power stage circuit is coupled to a first ground potential and the integrated driving circuit is coupled to a second ground potential, and where the first ground potential is connected to the second ground potential through a connecting wire; (ii) a first power terminal of the upper switch is coupled to a voltage source, and a second power terminal of the upper switch is coupled to a first power terminal of the lower switch; (iii) a second power terminal of the lower switch is coupled to a first voltage level, where the first voltage level is higher than a voltage level of the first ground potential; and (iv) the upper and lower switch driving sub circuits are configured to receive a control signal to respectively drive the upper and lower switches, where a driving signal is generated at a common node of the upper and lower switches to control the power switch.

Figure 2A:
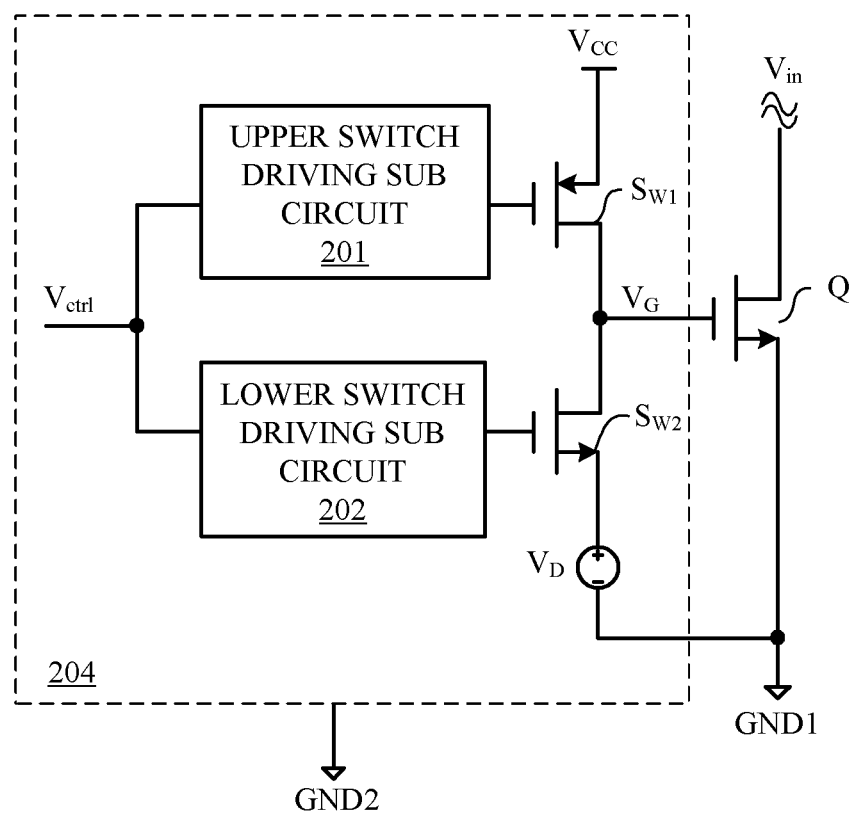
FIG. 2A shows a schematic diagram of an example power switch driving circuit in accordance with embodiments of the present invention.

Referring now to FIG. 2A, shown is a schematic diagram of an example power switch driving circuit in accordance with embodiments of the present invention. In this particular example, power switch driving circuit 204 can include a push-pull driving sub circuit that includes upper switch $S_{W1}$, lower switch $S_{W2}$, upper switch driving sub circuit 201, and lower switch driving sub circuit 202. Upper switch driving sub circuit 201 and lower switch driving sub signal 202 can receive control signal $V_{ctrl}$, and may generate driving signals based on control signal $V_{ctrl}$ to respectively drive upper switch $S_{W1}$ and lower switch $S_{W2}$.

A first power terminal (e.g., a source) of upper switch $S_{W1}$ can receive voltage source $V_{CC}$, while a second power terminal (e.g., a drain) can connect to a first power terminal (e.g., a drain) of lower switch $S_{W2}$. Also, voltage $V_G$ on a common node of upper switch $S_{W1}$ and lower switch $S_{W2}$ can be configured as a driving signal to drive (e.g., via a gate connection) power switch Q. A second power terminal of lower switch $S_{W2}$ can connect to voltage level or supply $V_D$, where voltage $V_D$ can have a voltage level that is slightly higher than ground potential GND1. For example, $V_D$ can be in a range of from about 200 mV to about 800 mV (e.g., about 500 mV). A first power terminal (e.g., a drain) of power switch Q can receive input voltage $V_{in}$, and a second power terminal (e.g., a source) can be coupled to ground potential GND1. In some cases, the second power terminal of power switch Q can alternatively be connected to voltage level $V_D$.

In this particular example, power switch driving circuit 204, the push-pull driving sub circuit including switches $S_{W1}$ and $S_{W2}$, and power switch Q, may not share the same ground potential. For example, power switch Q may have a ground potential of GND1, switches $S_{W1}$ and $S_{W2}$ may have an effective ground potential of GND1+$V_D$, and a remaining portion of driving circuit 204 (including upper and lower switch driving sub circuits 201 and 202) may have a ground potential of GND2. Therefore, there may be no directly connecting ground wire between power switch driving circuit 204 and the second power terminal of power switch Q. Thus, ground bounce of any such wire between GND1 and GND2 may not be a substantial side effect as to power switch Q, and there may be increased ground bounce isolation as to driving circuit 204.

Figure 2B:
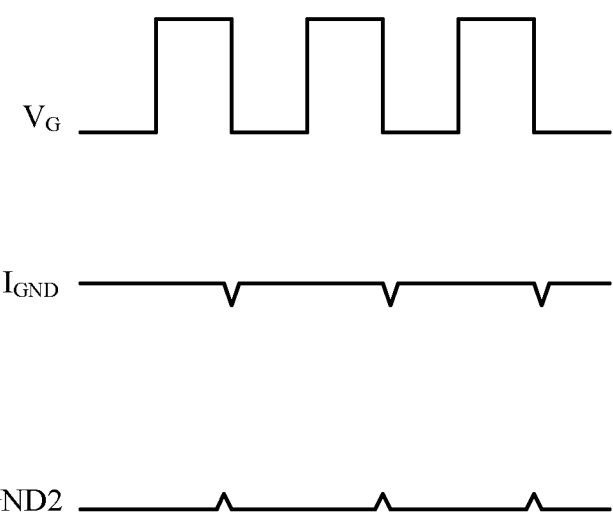
FIG. 2B is a waveform diagram showing an example operation of the power switch driving circuit of FIG. 2A.

FIG. 2B shows is a waveform diagram of an example operation of the power switching driving circuit shown in FIG. 2A. As shown, $I_{GND}$ from GND2 to GND1, and the ground bounce on GND2 may be lowered, at least as compared to the approach discussed above (see, e.g., FIG. 1B). In particular embodiments, ground bounce due to parasitic inductances and parasitic resistors on the connecting wire, and parasitic capacitance of power switch Q, can be substantially eliminated. In this way, ground potential fluctuation, such as in a printed-circuit board (PCB) layout, can be effectively eliminated. Also, the stability and reliability of the circuit system can be improved, as compared to conventional approaches.

Figure 3:
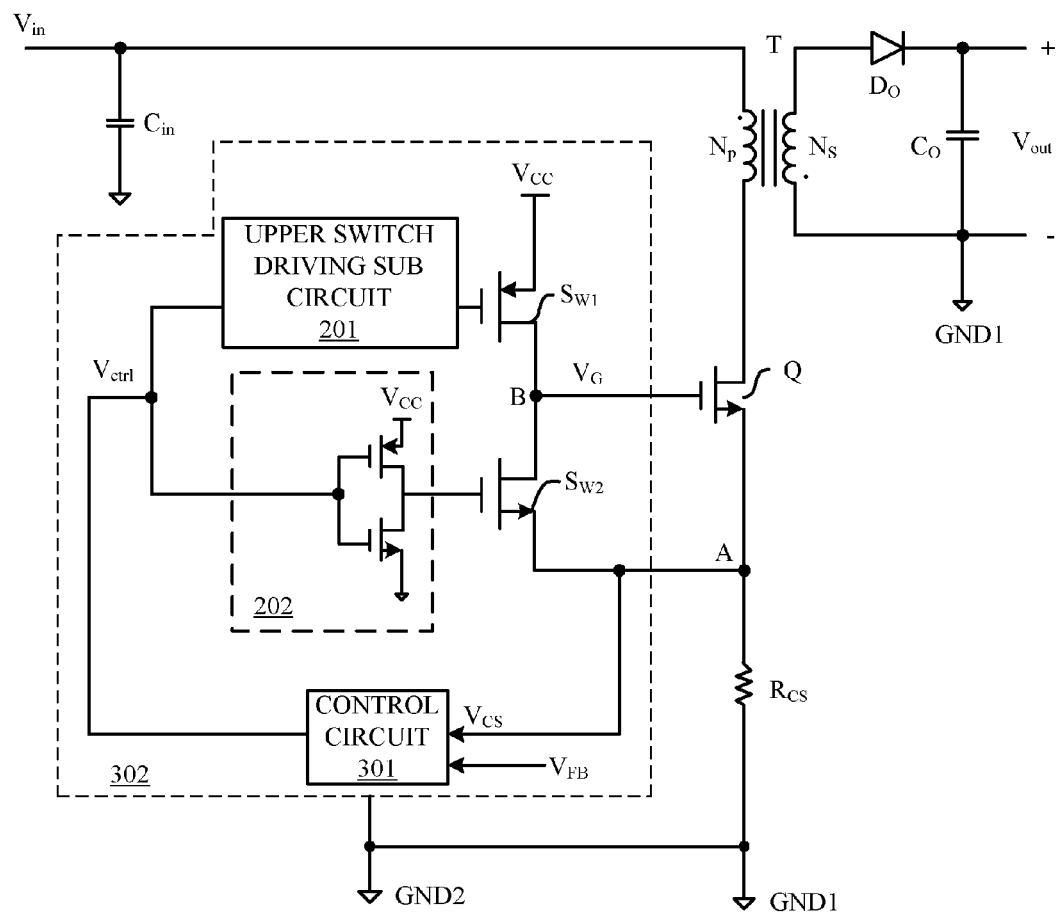
FIG. 3 shows a schematic diagram of an example power converter in accordance with embodiments of the present invention.

Referring now to FIG. 3, shown is a schematic diagram of an example power converter utilizing a power switch driving circuit, in accordance with embodiments of the present invention. In this particular example, the power stage circuit may utilize a flyback topology, and can include transformer T formed by primary winding $N_p$ and secondary winding $N_s$.

The power stage circuit may also include power switch Q, output diode $D_o$, and output capacitor $C_o$.

The power stage circuit can be used to receive input voltage $V_{in}$ after being filtered by input capacitor $C_{in}$. Control and driving circuit 302 can generate corresponding control signal $V_{ctrl}$ according to feedback signal $V_{FB}$ and sense voltage $V_{CS}$. For example, feedback signal $V_{FB}$ can represent output voltage $V_{out}$. Sense resistor $R_{CS}$ can connect between a second power terminal (e.g., a source) of power switch Q and ground potential GND1. Sense resistor $R_{CS}$ can generate sense voltage $V_{CS}$ at common node A of sense resistor $R_{CS}$ and the second power terminal of power switch Q.

Driving circuit 204 can receive control signal $V_{ctrl}$ to alternately turn on and off upper switch $S_{W1}$ and lower switch $S_{W2}$, and generate driving signal $V_G$ for power switch Q at common node B of upper switch $S_{W1}$ and lower switch $S_{W2}$. For example, one of upper and lower switches $S_{W1}$ and $S_{W2}$ may be on, while the other is off. In this way, a substantially constant output voltage $V_{out}$ can be generated at the output terminal of the power stage circuit, based on the control signal $V_{ctrl}$.

As shown in FIG. 3, a second power terminal (e.g., a source) of lower switch $S_{W2}$ can connect to common node A of sense resistor $R_{CS}$ and the second power terminal (e.g., a source) of power switch Q. Sense voltage $V_{CS}$ can be configured as a voltage level slightly above a ground level for connection at the second power terminal of lower switch $S_{W2}$. For example, sense voltage $V_{CS}$ can be voltage level $V_D$, as shown above in FIG. 2A.

Similar to the example of FIG. 2A, lower switch driving sub circuit 202 can also include a push-pull driving sub circuit to drive lower switch $S_{W2}$. As one skilled in the art will recognize, structures of the driving circuits are not limited to the above mentioned structures as shown in the example embodiments. Rather, other circuit structures, such as the driving circuit structures set forth in Chinese Patent Applications CN201210142372.9 and CN200910078846.6, can also be utilized in particular embodiments. Also, the upper switch, the lower switch, and the power switch can be N-type or P-type MOS transistors, bipolar transistors, or any other suitable switching devices.

It can be seen that by utilizing the power switch driving circuit shown in FIG. 3, the push-pull driving sub circuit (e.g., sub circuits 201 and 202, which may have ground GND2) and power switch Q (e.g., coupled to GND1 via resistor $R_{CS}$) may not have a same ground potential. Traditionally, as in integrated circuits (e.g., control and driving circuit 302 is integrated on a chip), if the second power terminal of lower switch $S_{W2}$ is connected to common ground GND2 (e.g., the second ground potential) of the integrated chip, common ground GND2 should connect to ground GND1 (e.g., the first ground potential) of the power stage (e.g., a main circuit) through a connecting wire. As a result, parasitic inductance and parasitic resistance on the connecting wire and parasitic capacitance of the power switch may lead to fluctuations on ground voltage, and current $I_{GND}$ can flow on portions of the common ground wire.

However, in the particular example of FIG. 3, the second power terminal (e.g., the source) of lower switch $S_{W2}$ can connect to a different voltage level $V_{CS}$ (or $V_D$). For example, this voltage level $V_{CS}$ (or $V_D$) can be a voltage level at common node A of sense resistor $R_{CS}$ and the second power terminal of power switch Q, which may be slightly higher than the ground potential. Thus, instead of connecting to a common ground of the integrated chip, potential fluctuations on the ground line and ground current $I_{GND}$ between common ground GND2 of the integrated chip caused by the connecting wire between GND2 and ground GND1 of the main circuit, can be substantially avoided.

Also in particular embodiments, a power converter can include a driving circuit as described above together with a power stage circuit and a control circuit. The control circuit can generate a control signal ($V_{ctrl}$) to control the power switch of the power stage circuit. The driving circuit can receive the control signal, and generate a driving signal to control the power switch.

The power switch driving circuit as described above can be configured to drive various types of power switches, such as MOSFETs. Also, the power switch driving circuit can connect to different types of power stage circuits and/or control circuits to form corresponding circuits according to different applications. The power stage circuit can be a non-isolated topology (e.g., buck or boost topology) or an isolated topology (e.g., flyback topology). The upper switch driving sub circuit and lower switch driving sub circuit can include, but are not limited to, the above disclosed forms. Therefore, any related alternatives, modifications and equivalents made by those skilled in the art may be included within the spirit and scope of the invention.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit, comprising:
   a) an upper switch having a first power terminal coupled to a voltage source, and a second power terminal coupled to a driving signal;
   b) a lower switch having a first power terminal coupled to said driving signal, and a second power terminal coupled to a first voltage level, wherein said first voltage level is higher than a first ground potential;
   c) an upper switch driving sub circuit configured to receive a control signal, and to drive said upper switch in response thereto;
   d) a lower switch driving sub circuit configured to receive said control signal, and to drive said lower switch in response thereto; and
   e) a power switch in a power converter, said power switch having a first power terminal coupled to a primary side of a four-terminal transformer, a control terminal coupled to said driving signal, and a second power terminal coupled to said first ground potential.

2. The circuit of claim 1, further comprising a resistor coupled between said second power terminal of said power switch and said first ground potential, wherein a voltage of a common node of said resistor and said second power terminal of said power switch is configured as said first voltage level.

3. The circuit of claim 1, wherein said upper switch comprises a PMOS transistor, and said lower switch comprises an NMOS transistor.

4. A power converter, comprising:
   a) a power stage circuit in said power converter, said power stage circuit being controlled by said driving signal;
   b) a control circuit configured to generate said control signal; and
   c) the circuit of claim 1, configured to generate said driving signal according to said control signal.

5. The power converter of claim 4, wherein:
   a) said power stage circuit employs flyback topology;

b) said control circuit is configured to receive said first voltage level and a feedback signal, and to generate said control signal; and c) said feedback signal is configured to represent an output voltage of said power stage circuit.

6. The circuit of claim 1, wherein said first voltage level is from about 200 mV to about 800 mV higher than said first ground potential.

7. The circuit of claim 1, wherein said first voltage level and said first ground potential have no directly connecting ground wire therebetween.

8. The circuit of claim 1, further comprising a voltage source coupled between said first voltage level and said first ground potential.

9. An integrated driving circuit configured to drive a power switch in a power stage circuit, the integrated driving circuit comprising:
   a) a push-pull driving sub circuit comprising an upper switch and a lower switch, an upper switch driving sub circuit, and a lower switch driving sub circuit, wherein said power stage circuit is coupled to a first ground potential and said integrated driving circuit is coupled to a second ground potential, and wherein said first ground potential is connected to said second ground potential through a connecting wire;
   b) a first power terminal of said upper switch coupled to a voltage source, and a second power terminal of said upper switch coupled to a first power terminal of said lower switch;
   c) a second power terminal of said lower switch coupled to a first voltage level, wherein said first voltage level is higher than said first ground potential; and
   d) said upper and lower switch driving sub circuits configured to receive a control signal to respectively drive said upper and lower switches, wherein a driving signal is generated at a common node of said upper and lower switches to control said power switch, said power switch being coupled to a primary side of a four-terminal transformer.

10. The integrated driving circuit of claim 9, wherein:

a) a first power terminal of said power switch is configured to receive an input voltage; and b) a second power terminal of said power switch is coupled to said first ground potential through a resistor, wherein said first voltage level is a voltage at a common node of said resistor and said second power terminal of said power switch.

11. The integrated driving circuit of claim 9, wherein said upper switch comprises a PMOS transistor, and said lower switch comprises an NMOS transistor.

12. The integrated driving circuit of claim 9, wherein said first voltage level and said second ground potential have no directly connecting ground wire therebetween.

* * * * *